United States Patent
Ibbetson et al.

(10) Patent No.: US 7,985,970 B2
(45) Date of Patent: *Jul. 26, 2011

(54) HIGH VOLTAGE LOW CURRENT SURFACE-EMITTING LED

(75) Inventors: James Ibbetson, Santa Barbara, CA (US); Sten Heikman, Goleta, CA (US)

(73) Assignee: Cree, Inc., Goleta, CA (US)

( * ) Notice: Subject to any disclaimer, the term of this patent is extended or adjusted under 35 U.S.C. 154(b) by 0 days.

This patent is subject to a terminal disclaimer.

(21) Appl. No.: 12/418,816

(22) Filed: Apr. 6, 2009

(65) Prior Publication Data

US 2010/0155746 A1    Jun. 24, 2010

(51) Int. Cl.
*H01L 21/02* (2006.01)
(52) U.S. Cl. ....... 257/77; 257/79; 257/99; 257/E27.121; 257/E33.005; 257/E33.006
(58) Field of Classification Search .............. 257/79–99, 257/184, E27.121, 33.001–5, 56
See application file for complete search history.

(56) References Cited

U.S. PATENT DOCUMENTS

| | | | |
|---|---|---|---|
| 4,946,547 A | 8/1990 | Palmour et al. | 156/643 |
| 5,200,022 A | 4/1993 | Kong et al. | 156/612 |
| RE34,861 E | 2/1995 | Davis et al. | 437/100 |
| 6,547,249 B2* | 4/2003 | Collins et al. | 257/88 |
| 7,518,158 B2* | 4/2009 | Keller et al. | 257/98 |
| 7,683,377 B2* | 3/2010 | Nagai | 257/79 |
| 7,821,023 B2* | 10/2010 | Yuan et al. | 257/98 |
| 2002/0139987 A1* | 10/2002 | Collins et al. | 257/88 |
| 2005/0139252 A1* | 6/2005 | Shim | 136/244 |
| 2008/0179602 A1* | 7/2008 | Negley et al. | 257/88 |
| 2008/0211416 A1* | 9/2008 | Negley et al. | 315/193 |
| 2009/0008654 A1* | 1/2009 | Nagai | 257/88 |
| 2009/0050907 A1* | 2/2009 | Yuan et al. | 257/88 |
| 2009/0050908 A1* | 2/2009 | Yuan et al. | 257/88 |
| 2009/0096386 A1* | 4/2009 | Yeh et al. | 315/294 |
| 2009/0109151 A1* | 4/2009 | Kim et al. | 345/83 |
| 2009/0261356 A1* | 10/2009 | Lee et al. | 257/88 |
| 2009/0267085 A1* | 10/2009 | Lee et al. | 257/88 |
| 2010/0059733 A1* | 3/2010 | Shei et al. | 257/13 |
| 2010/0155746 A1* | 6/2010 | Ibbetson et al. | 257/88 |
| 2010/0252840 A1* | 10/2010 | Ibbetson et al. | 257/88 |

OTHER PUBLICATIONS

Cree® EZ700™ and EZ1000 EZBright™ LED chip, data sheets.
TitanTurbo™ LED Light Engines by Lamina, 2008 data sheet1-14.
U.S. Appl. No. 11/656,759, filed Jan. 22, 2007.
U.S. Appl. No. 11/899,790, filed Sep. 7, 2007.
U.S. Appl. No. 11/473,089, filed Jun. 21, 2006.
Acriche LED by Seoul Semiconductor data sheet, dated: 2007, as available at www.acriche.com/en/product/prd/acriche.asp As retrieved on Jun. 22, 2009 pp. 1-2.

* cited by examiner

*Primary Examiner* — Michael S Lebentritt
(74) *Attorney, Agent, or Firm* — Myers Bigel Sibley & Sajovec

(57) ABSTRACT

A monolithic LED chip is disclosed comprising a plurality of junctions or sub-LEDs ("sub-LEDs") mounted on a submount. The sub-LEDs are serially interconnected such that the voltage necessary to drive the sub-LEDs is dependent on the number of serially interconnected sub-LEDs and the junction voltage of the sub-LEDs. Methods for fabricating a monolithic LED chip are also disclosed with one method comprising providing a single junction LED on a submount and separating the single junction LED into a plurality of sub-LEDs. The sub-LEDs are then serially interconnected such that the voltage necessary to drive the sub-LEDs is dependent on the number of the serially interconnected sub-LEDs and the junction voltage of the sub-LEDs.

10 Claims, 5 Drawing Sheets

FIG. 5
PRIOR ART
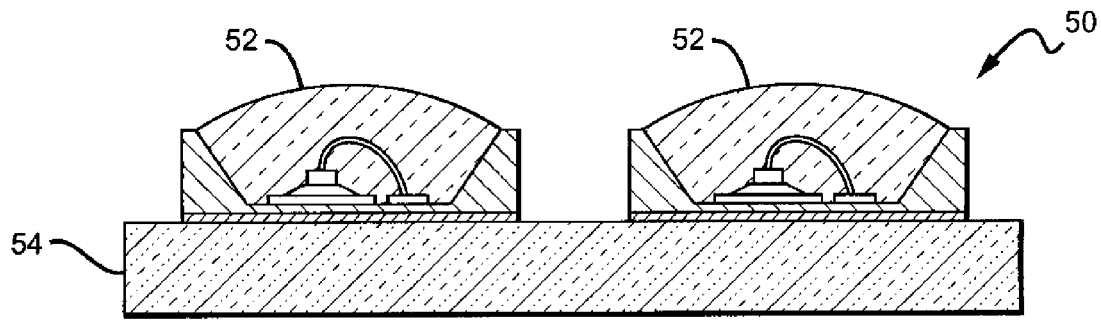
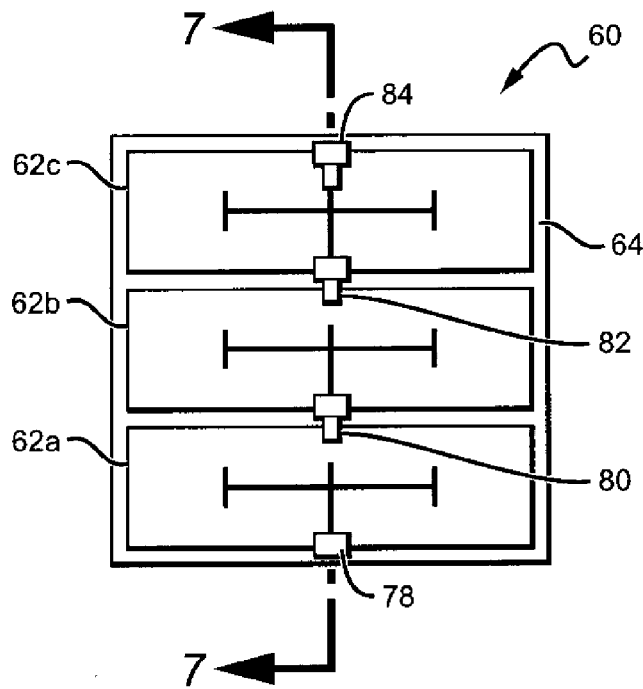
FIG. 6
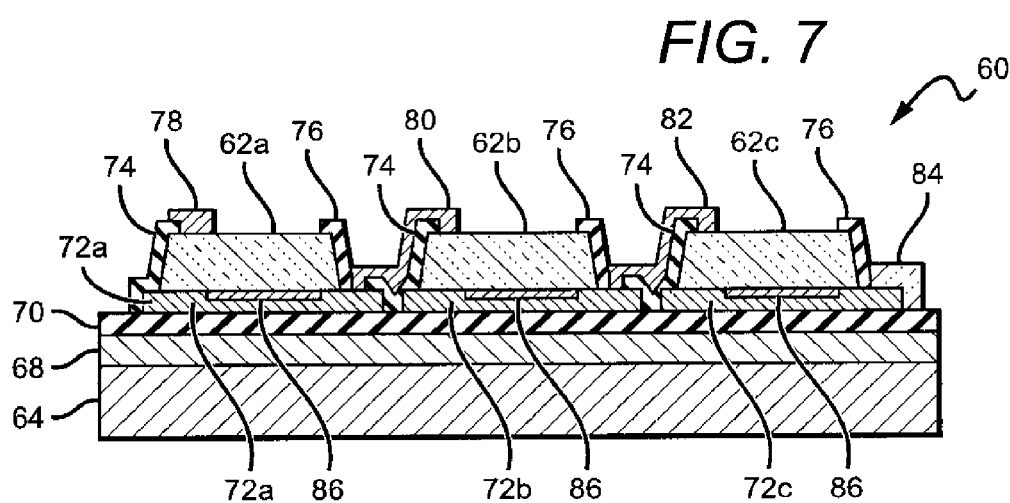
FIG. 7

FIG. 8
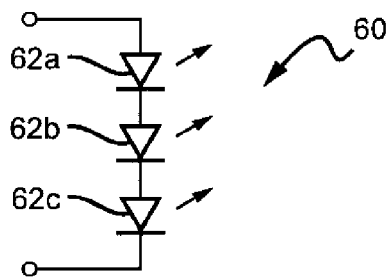
FIG. 9
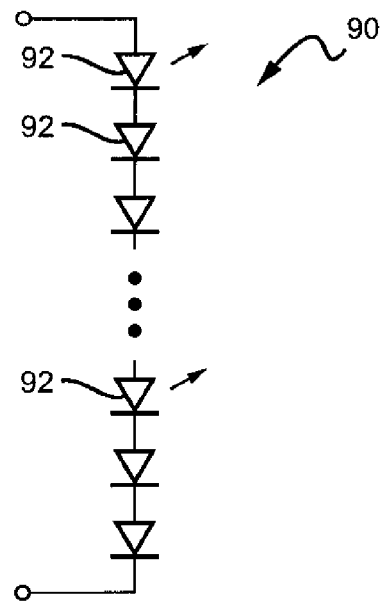
FIG. 10
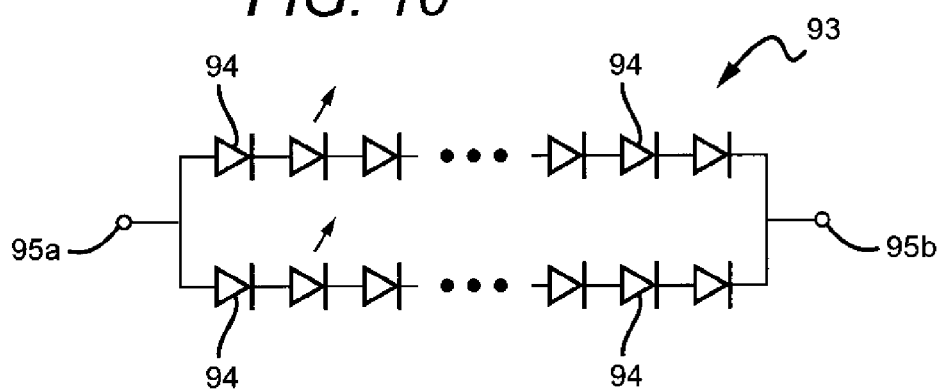
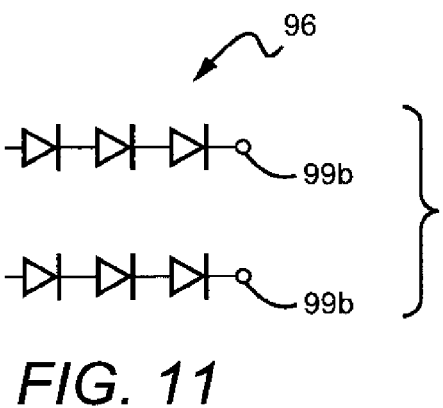
FIG. 11

*FIG. 12*
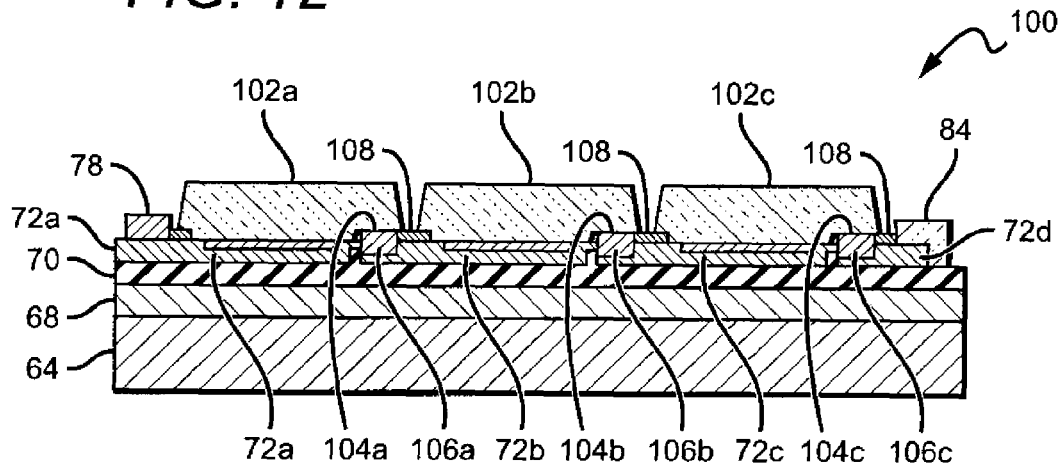
*FIG. 13*
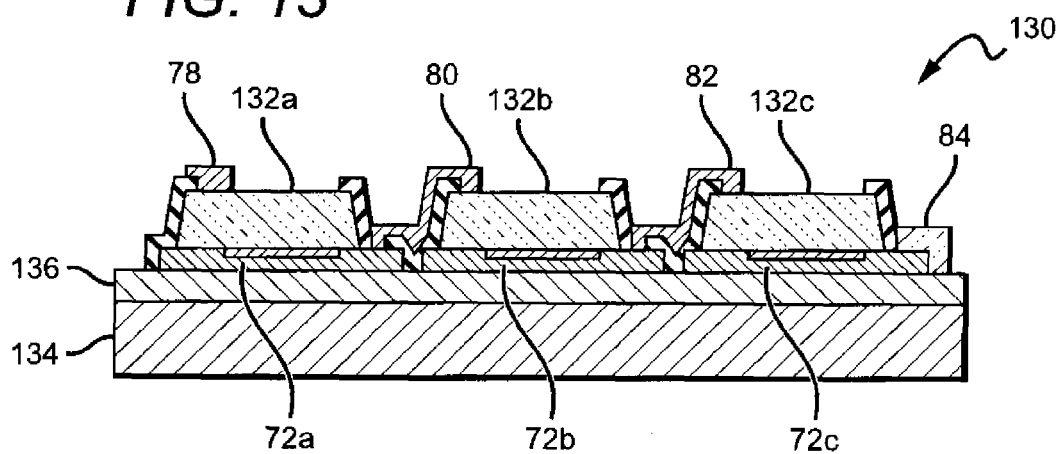
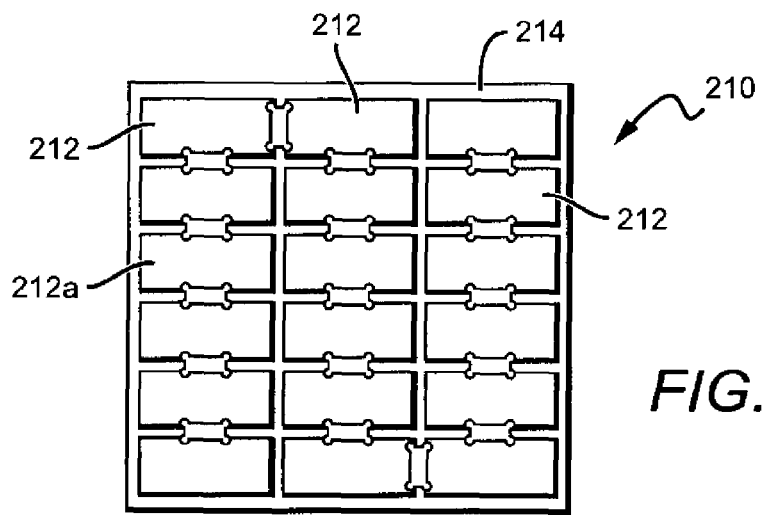
*FIG. 16*

US 7,985,970 B2

HIGH VOLTAGE LOW CURRENT SURFACE-EMITTING LED

BACKGROUND OF THE INVENTION

1. Field of the Invention

This invention relates to light emitting diode (LED) chips and in particular LED chips having multiple series connected junctions interconnected to allow for high voltage and low current operation.

2. Description of the Related Art

Light emitting diodes (LED or LEDs) are solid state devices that convert electric energy to light, and generally comprise one or more active layers of semiconductor material sandwiched between oppositely doped layers. When a bias is applied across the doped layers, holes and electrons are injected into the active layer where they recombine to generate light. Light is emitted from the active layer and from all surfaces of the LED.

In order to use an LED chip in a circuit or other like arrangements, it is known to enclose an LED chip in a package to provide environmental and/or mechanical protection, color selection, light focusing and the like. An LED package can also include electrical leads, contacts or traces for electrically connecting the LED package to an external circuit. FIG. 1 shows a conventional LED package that generally comprises a single LED chip 12 mounted on a reflective cup 13 by means of a solder bond or conductive epoxy. One or more wire bonds 11 connect the ohmic contacts of the LED chip 12 to leads 15A and/or 15B, which may be attached to or integral with the reflective cup 13. The reflective cup 13 can be filled with an encapsulant material 16 which can contain a wavelength conversion material such as a phosphor. Light emitted by the LED at a first wavelength can be absorbed by the phosphor, which can responsively emit light at a second wavelength. The entire assembly is then encapsulated in a clear protective resin 14, which may be molded in the shape of a lens over the LED chip 12.

FIG. 2 shows another conventional LED package 20 that may be more suited for high power operations that can generate more heat. In the LED package 20, one or more LED chips 22 are mounted onto a carrier such as a printed circuit board (PCB) carrier, substrate or submount 23. A reflector 24 can be included on the submount 23 that surrounds the LED chip(s) 22 and reflects light emitted by the LED chips 22 away from the package 20. Different reflectors can be used such as metal reflectors, omni-directional reflectors (ODRs), and distributed Bragg reflectors (DBRs). The reflector 24 can also provide mechanical protection to the LED chips 22. One or more wirebond connections 11 are made between ohmic contacts on the LED chips 22 and electrical traces 25A, 25B on the submount 23. The mounted LED chips 22 are then covered with an encapsulant 26, which may provide environmental and mechanical protection to the chips while also acting as a lens. The metal reflector 24 is typically attached to the carrier by means of a solder or epoxy bond.

Many LED components for solid state lighting applications attempt to achieve high light output by operating single LED chips at as high as possible current and at a low voltage typical for individual LEDs. FIGS. 3 and 4 show one commercially available LED 30 available from Cree® Inc. under the EZ700™ LED product designation. The LED comprises a single LED junction 32 as welt as a current spreading structure 34 on its top to spread current from the top contact 36. Current spreading layers can also be included. The particular voltage level for these types of single junction LED chips can be dependant upon the particular material system used for the LEDs and the voltage necessary based on junction voltage. For example, some Group-III nitride based LEDs can have junction voltage in the 2.5 to 3.5 volt range and increased luminous flux for these LEDs can be achieved by applying elevated current levels. One disadvantage of this approach is that at the systems level high current operation necessitates relatively expensive drivers to provide the constant DC current source for such components. Further, there can be limits to the level of current that can be applied to these LED chips and if the single junction fails, the chip can be unusable.

Higher light output can be achieved at the assembly level by mounting several LED packages onto a single circuit board. FIG. 5 shows a sectional view of one such distributed integrated LED package array 50 comprising a plurality of LED packages 52 mounted to a substrate/submount 54 to achieve higher luminous flux. Typical arrays include many LED packages, with FIG. 5 only showing two for ease of understanding and illustration. Alternatively, higher flux components have been provided by utilizing arrays of cavities, with a single LED chip mounted in each of the cavities. (e.g. TitanTurbo™ LED Light Engines provided by Lamina, Inc.). This multiple LED component arrangement can also allow for operation under high voltage and low current by assembling the multiple LED packages of a suitable current rating in series at the circuit board level. Driving solid state lighting components at high voltage and low currents may provide for lower cost driver solutions and ultimately lower system costs. However, the lower driver cost for such solutions can be outweighed by the high cost of the multiple individual components.

These LED array solutions can be less compact than desired as they provide for extended non-light emitting "dead space" between adjacent LED packages and cavities. This dead space provides for larger devices, and can limit the ability to shape the output beam by a single compact optical element like a collimating lens or reflector into a particular angular distribution. This makes the construction of solid state lighting luminares that provide for directed or collimated light output within the form factor of existing lamps or even smaller difficult to provide. This can present challenges in providing a compact LED lamp structure incorporating an LED component that delivers light flux levels in the 1000 Lumen and higher range from a small optical source.

SUMMARY OF THE INVENTION

One embodiment of a monolithic LED chip according to the present invention comprises a plurality of junctions or sub-LEDs ("sub-LEDs") mounted on a submount. The sub-LEDs are serially interconnected such that the voltage necessary to drive the plurality of sub-LEDs is dependent on the number of serially interconnected sub-LEDs and the junction voltage of the sub-LEDs.

One embodiment according to the present invention for fabricating a monolithic LED chip comprises providing a single junction LED on a submount and separating the single junction LED into a plurality of sub-LEDs. The sub-LEDs are then serially interconnected such that the voltage necessary to drive the plurality of sub-LEDs is dependent on the number of the serially interconnected sub-LEDs and the junction voltage of the sub-LEDs.

One embodiment of an LED chip according to the present invention comprises a plurality of sub-LEDs mounted on a submount, wherein the sub-LEDs are formed from a single junction LED. Electrically conductive and electrically insulating features serially interconnect the sub-LEDs such that an electrical signal applied to the serially interconnected sub-LEDs along the electrically conductive features spreads to the serially interconnected sub-LEDs Another embodiment of an LED chip according to the present invention comprises a plurality of sub-LEDs mounted on a submount. A plurality of bottom contacts are included, each of which is between one of the sub-LEDs and the submount. Connector traces serially interconnect the sub-LEDs and insulating features insulate portions of the sub-LEDs from the connector traces.

Still another embodiment of an LED chip according to the present invention comprises a plurality of sub-LEDs mounted on a submount. The sub-LEDs are separated by isolation implants and the sub-LEDs are serially interconnected.

These and other aspects and advantages of the invention will become apparent from the following detailed description and the accompanying drawings which illustrate by way of example the features of the invention.

BRIEF DESCRIPTION OF THE DRAWINGS

FIG. 5 is a sectional view of a prior art LED package;

FIG. 6 is a top view of one embodiment of a monolithic LED chip according to the present invention.

FIG. 7 is a sectional view of the monolithic LED chip of FIG. 6 taken along section lines 7-7;

FIG. 8 is a schematic showing the interconnections in the LED chip in FIG. 6;

FIG. 9 is a schematic showing the interconnections between another embodiment of and LED chip according to the present invention;

FIG. 10 is a schematic showing the interconnections between another embodiment of and LED chip according to the present invention;

FIG. 11 is a schematic showing the interconnections between another embodiment of and LED chip according to the present invention;

FIG. 12 is a sectional view of another embodiment of a monolithic LED chip according to the present invention;

FIG. 13 is a sectional view of another embodiment of a monolithic LED chip according to the present invention;

FIG. 16 is a top view of a monolithic LED chip according to the present invention having one failed junction or sub-LED.

DETAILED DESCRIPTION OF THE INVENTION

Figure 1:
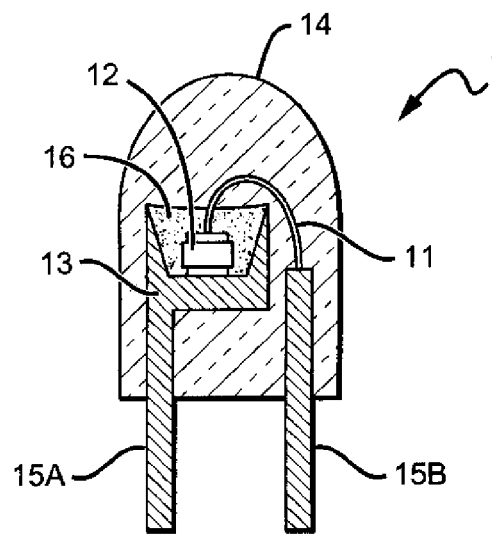
FIG. 1 shows a sectional view of a prior art LED package.
Figure 2:
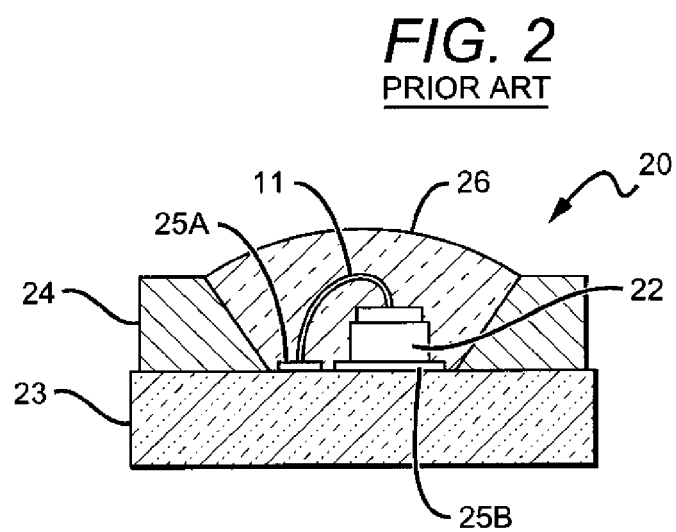
FIG. 2 shows a sectional view of another prior art LED package.

The present invention comprises a monolithic LED chip or component having a plurality of LED junctions or sub-LEDs mounted onto a substrate/submount ("submount") to create a single compact optical source element. As used in the present application, monolithic refers to LED chips wherein the emitters are mounted on one substrate or submount. According to the present invention, at least some of the junctions or sub-LEDs are arranged on the submount, with different embodiments providing multiple series interconnections, or combinations of series/parallel interconnections. The LED chips according to the present invention can emit different colors of light, with some embodiments emitting white light.

In one embodiment, an LED chip is provided having the same dimensions or footprint as a conventional high output single junction LED that uses low voltage and high current operation to provide high luminous flux operation. The active area of this type of conventional LED chip substantially covers its submount. According to the present invention, this area is divided into a plurality of junctions or sub-LEDs ("sub-LEDs") using different methods, such as a standard etching, photolithography, or ion implanting. Combinations of electrically conductive interconnects and insulating features can be provided to interconnect the sub-LEDs in series on the submount.

Since electrical power is provided at high AC voltage, operating conventional single junction LEDs and LED lighting systems from the grid requires some type of transformer and converter circuitry, which can be costly, bulky and lossy. The present invention provides for a novel LED chip architecture that is designed to operate at a high voltage and low current rather than the existing low voltage and high current configuration. An equivalent overall LED performance can be maintained, while at the same time maintaining the overall size of the LED chip and the requirements for contacting the LED chip. Equivalent performance is achieved by incorporating the functional elements of the existing single junction LED chip into each sub-LED and its junction. The high voltage and low current operation is achieved by connecting the individual sub-LEDs in series on the same submount used for a single junction LED chip. Preferably, the individual sub-LEDs are densely packed to maximize the active emission area for a given chip footprint. In one embodiment according to the present invention, the alignment tolerance between and critical dimension of each fabrication level is 2 um or less so that little active area is wasted between adjacent junctions.

The number of sub-LEDs can be tailored or customized to meet the available voltage level or the voltage level can be tailored to meet the number of junctions presented by the sub-LEDs. The number of sub-LEDs on a submount can be as little as three or in the hundreds depending on the available operating voltage. The LED chip operating voltage can be tailored for the end application by selecting the appropriate number and size of sub-LEDs per chip. For example, a 16×225 µm×225 µm multiple sub-LED device operating at 50 volts and 22 mA (e.g. with 15 sub-LEDs), can operate with the same output characteristics as a similar sized single junction device operating at 3 V and 350 mA.

The present invention can be used to fabricate many different LED chips having essentially the same size and footprint of many commercially available single junction LED chips, such as the EZ Bright® EZ700 and EZ1000 LED chips commercially available from Cree® Inc. The EZ700 can have a chip area of approximately 680×680 µm and an active junction area of approximate 650×650 µm. The EX1000 LED chips can have a chip area of approximately 980×980 µm and an active junction area of approximate 950×950 µm. Both these are commercially provided with a single junction, and according to the present invention this single junction arrangement can instead be provided as multiple sub-LEDs that can then serially interconnected.

A different number of sub-LEDs, and therefore target operating voltage and current, can be achieved simply by changing the fabrication mask layout for forming the sub-LEDs and conductive interconnects, while keeping the same fabrication process. For example, a monolithic LED chip according to the present invention can have 20 serially connected sub-LEDs.

Different material systems for each of the sub-LEDs can present different sub-LED junction voltages. For Group-III nitride sub-LEDs a driving voltage of approximately 60 volts (or 3 volts per junction) can be used with an operating current of approximately 20 mA. In still other applications using U.S. grid power of approximately 150 volts (peak to valley), the monolithic LED chip can comprise 50 serially connected sub-LEDs at 3 volts per junction. For European grid power of over approximately 350 volts (peak to valley) the monolithic chip can comprise over 100 serially connected sub-LEDs. A high voltage and low current LED chip allows for the use of more efficient driver circuitry in high power lighting systems.

Different embodiments of monolithic LED chips according to the present invention can also comprise more than one group of series connected sub-LEDs on a single submount. This can require two voltages of the same or different level to be applied to the submount to drive the series connected sub-LED, depending on the number of sub-LEDs in each serially connected string. Other embodiments can comprise different combinations of series and parallel interconnected sub-LEDs. In still other embodiments, LED chips can be provided with the sub-LED already etched, and the operating voltage can be determined based on the number of sub-LEDs that are interconnected in series. This allows for a standard LED-chip with a standard number of sub-LEDs to be provided, with the LED chips having different interconnects to serially connect some or all of the sub-LEDs to achieve the desired operating voltage. This approach, however, can result in less than all of the sub-LEDs being utilized on the LED chip.

The embodiments according to the present invention differ from the conventional LED chip architecture and technology in a number of ways. The present invention allows for breaking up a single junction LED into two or many more serially connected sub-LEDs on a monolithic surface-emitting chip. Each of the sub-LEDs can be electrically isolated from the others (apart from the traces), by different combination of electrical conducting and electrically insulating layers and features. In different embodiments this isolation may also require inserting an electrical insulator layer between the junctions and the conductive submount or backside metallization, and creating individual ohmic contacts to each junction.

Still another advantage of the multi-junction design is that the process yield (good dice per wafer) may increase due to its inherent defect tolerance. While a single shorting junction defect would fail a single junction device, the same shorting defect on one of the junctions in a multi-junction device would fail only an individual junction. The electrical signal would pass through the defective junction and although the defective junction would not emit light, the remaining junctions would operate normally. All else being equal, the higher yield allowed by the present invention can reduce the cost of LED lighting on a lumens per dollar basis.

Further, compared to the alternative of stringing multiple small LED chips or LED packages in series to achieve high voltage/low current operation at the system level (e.g. a light bulb), the invention allows for significantly smaller source size by having the emitting junctions closer. This results in a source that more closely resembles a point source, allowing for greater efficiency and flexibility in the design of secondary optics to control the radiation pattern. Another advantage is that by using power signals to drive the monolithic chip that are closer to the conventional grid power, losses in converting the grid power can be reduced. Different embodiments according to the present invention can result in up to a 7 percent increase in system operating efficiency as a result of reduced conversion losses alone. The present invention also allows for reduction in the size of the conversion drive circuitry, which in turn reduces the overall size of the emitter package or solid state lighting package.

The present invention can be utilized at the LED chip level to replace single junction LED chips with series connected multiple junction LED chips. Alternatively, the present invention can be applied to larger area applications, such as the formation of series connection multiple LEDs, sub-LEDs or junctions at the wafer level or at portions of the wafer. The amount of area can depend on different factors such as the desired operating voltage and area to be covered by the different junctions. Different embodiments of the present invention can also have sub-LEDs covering different areas of the wafer or submount at the LED chip level.

The present invention is described herein with reference to certain embodiments, but it is understood that the invention can be embodied in many different forms and should not be construed as limited to the embodiments set forth herein. In particular, the present invention is described below in regards to multiple serially connected sub-LEDs in different configurations, but it is understood that the present invention can be used many other configurations. The sub-LEDs and different components can have different shapes and sizes beyond those shown and different numbers of sub-LED can be included in the array. Some or all of the sub-LEDs can be coated with a down-converter coating that can comprise a phosphor loaded binder ("phosphor/binder coating").

It is also understood that when an element such as a layer, region or substrate is referred to as being "on" another element, it can be directly on the other element or intervening elements may also be present. Furthermore, relative terms such as "inner", "outer", "upper", "above", "lower", "beneath", and "below", and similar terms, may be used herein to describe a relationship of one layer or another region. It is understood that these terms are intended to encompass different orientations of the device in addition to the orientation depicted in the figures.

Although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Embodiments of the invention are described herein with reference to cross-sectional view illustrations that are schematic illustrations of embodiments of the invention. As such, the actual thickness of the layers can be different, and variations from the shapes of the illustrations as a result, for example, of manufacturing techniques and/or tolerances are expected. Embodiments of the invention should not be construed as limited to the particular shapes of the regions illustrated herein but are to include deviations in shapes that result, for example, from manufacturing. A region illustrated or described as square or rectangular will typically have rounded or curved features due to normal manufacturing tolerances. Thus, the regions illustrated in the figures are schematic in nature and their shapes are not intended to illustrate the precise shape of a region of a device and are not intended to limit the scope of the invention.

Figure 3:
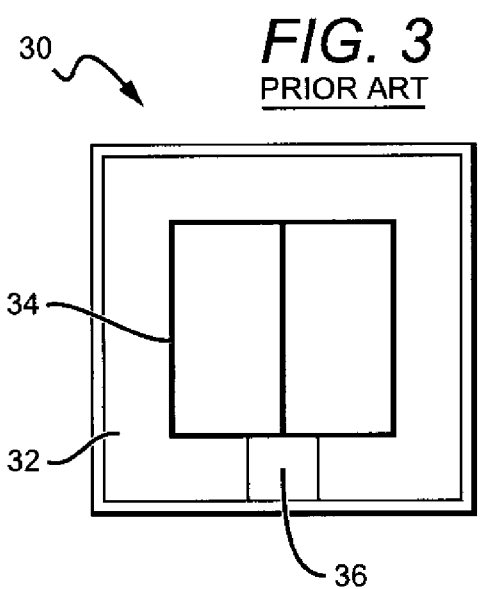
FIG. 3 shows a top view of a prior art LED chip.
Figure 4:
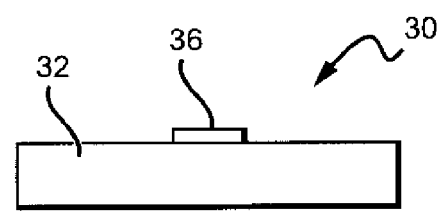
FIG. 4 is a side elevation view of the prior art LED chip in FIG. 3.

FIGS. 6 and 7 show one embodiment of a high voltage and low current monolithic LED chip 60 according to the present invention comprising multiple serially connected sub-LEDs 62*a-c* mounted on submount 64. It is understood that in other embodiments, the submount 64 can comprise a growth substrate for the LED chip 60. This embodiment is directed to a monolithic LED chip 60 that is used instead of a single junction LED chip (e.g. as shown in FIGS. 3 and 4) that have an active area substantially covering the submount 64. The multiple serially connected sub-LEDs 62*a-c* are arranged to cover the same surface area or footprint of the single junction LED, except that a certain portions of the active area may be removed to separate the sub-LEDs 62*a-c*, and to allow for serial connection of the sub-LEDs 62*a-c*. Although only three sub-LEDs 62*a-c* are shown it is understood that two or many more sub-LEDs can be included depending on different factors such as the desired operating voltage. As mentioned above, the present invention and the embodiments described herein are equally applicable to larger area arrangements, such as at the wafer level or portions of the wafer.

FIG. 8 shows a schematic one embodiment of the serial interconnections between the sub-LEDs 62*a-c* in the LED chip 60. As mentioned above, many more LED chips can be provided in different series and parallel interconnections. FIG. 9 shows a schematic of another embodiment of an LED chip 90 according to the present invention having more than three serially connected sub-LEDs 92. FIG. 10 shows a schematic of another embodiment of an LED chip 93 according to the present invention having two series connected strings of sub-LED chips 94 connected in parallel between a single input and output contact points 95*a*, 95*b*. FIG. 11 shows a schematic of still another embodiment of an LED chip 96 according to the present invention comprising two series connected strings of LED chips 98 both having their own input and output contact points 99*a*, 99*b*. These are only a few of the many different series and parallel arrangements that can be provided in the LED chips according to the present invention.

Referring again to FIGS. 6 and 7, each of the sub-LEDs 62*a-c* can have the similar features and characteristics as a single junction LED that covers the entire submount 64. The sub-LEDs 62*a-c* can have many different semiconductor layers arranged in different ways. The fabrication and operation of the layers that comprise LEDs and sub-LEDs 62*a-c*, is generally known in the art and only briefly discussed herein. The layers of the sub-LEDs 62*a-c* can be fabricated using known processes with a suitable process being fabrication using metal organic chemical vapor deposition (MOCVD). The layers of the sub-LEDs 62*a-c* generally comprise an active layer/region sandwiched between first and second oppositely doped epitaxial layers all of which are formed successively on a growth substrate.

It is understood that additional layers and elements can also be included in each of the sub-LEDs 62*a-c*, including but not limited to buffer, nucleation, contact and current spreading layers as well as light extraction layers and elements. It is also understood that the oppositely doped layers can comprise multiple layers and sub-layers, and well as supper lattice structures and inter layers. The active region can comprise single quantum well (SQW), multiple quantum well (MQW), double heterostructure or super lattice structures. The order of the layers can be different and in the embodiment shown, the first or bottom epitaxial layer can be an n-type doped layer and the second or top epitaxial layer can be a p-type doped layer, although in other embodiments the first layer can be p-type doped and the second layer n-type doped. Embodiments where the p-type layer is the bottom layer typically correspond with sub-LEDs that are flip-chip mounted on the submount 64. In flip-chip embodiments it is understood that the top layer can be the growth substrate, and in different embodiments all or a portion of the growth substrate can be removed. In those embodiments where the growth substrate is removed, the n-type doped layer is exposed as the top surface. In still other embodiments portions of the growth substrate can be left on the sub-LEDs 62*a-c* and in some embodiments can be shaped or textured to enhance light extraction.

The layers of the sub-LEDs 62*a-c* may be fabricated from different material systems, with preferred material systems being Group-III nitride based material systems. Group-III nitrides refer to those semiconductor compounds formed between nitrogen and the elements in the Group III of the periodic table, usually aluminum (Al), gallium (Ga), and indium (In). The term also refers to ternary and quaternary compounds such as aluminum gallium nitride (AlGaN) and aluminum indium gallium nitride (AlInGaN). In one embodiment according to the present invention, the n- and p-type layers are gallium nitride (GaN) and the active region is InGaN, but it is understood that these embodiment may include additional layers with different compositions such as AlGaN buffer layers, supper lattice structures with GaN/InGaN layers, and cap layers comprising AlGaN. In alternative embodiments the n- and p-type layers may be AlGaN, aluminum gallium arsenide (AlGaAs) or aluminum gallium indium arsenide phosphide (AlGaInAsP). Different compositions of Group-III nitride material systems can have different junction voltages, such as in the range of 2.5 to 3.5 volts.

The sub-LED growth substrate (not shown) can be made of many materials such at sapphire, silicon, silicon carbide, aluminum nitride (AlN), GaN, with a suitable substrate being a 4H polytype of silicon carbide, although other silicon carbide polytypes can also be used including 3C, 6H and 15R polytypes. Silicon carbide has certain advantages, such as a closer crystal lattice match to Group III nitrides than sapphire and results in Group III nitride films of higher quality. Silicon carbide also has a very high thermal conductivity so that the total output power of Group-III nitride devices on silicon carbide is not limited by the thermal dissipation of the substrate (as may be the case with some devices formed on sapphire). SiC substrates are available from Cree Research, Inc., of Durham, N.C. and methods for producing them are set forth in the scientific literature as well as in a U.S. Pat. Nos. Re. 34,861; 4,946,547; and 5,200,022.

Each of the sub-LEDs 62*a-c* can have first and second contacts and in the embodiment shown the sub-LEDs 62*a-c* have vertical geometry. As described below, the sub-LEDs 62*a-c* can be contacted on their top surface and on their bottom surface as in conventional vertical geometry devices. As further described below in other embodiments, the present invention can also be used with LEDs having lateral geometry wherein the sub-LEDs can be contacted from one side or surface of the sub-LEDs, instead of top and bottom surfaces as is the case for vertical geometry. The first and second contacts can comprise many different materials such as Au, copper (Cu) nickel (Ni), indium (In), aluminum (Al), silver (Ag), or combinations thereof. In still other embodiments the first and second contacts can comprise conducting oxides and transparent conducting oxides such as indium tin oxide, nickel oxide, zinc oxide, cadmium tin oxide, titanium tungsten nickel, indium oxide, tin oxide, magnesium oxide, $ZnGa_2O_4$, $ZnO_2/Sb$, $Ga_2O_3/Sn$, $AgInO_2/Sn$, $In_2O_3/Zn$, $CuAlO_2$, $LaCuOS$, $CuGaO_2$ and $SrCu_2O_2$. The choice of material used can depend on the location of the contacts as well as the desired electrical characteristics such as transparency, junction resistivity and sheet resistance.

Some embodiments of sub-LEDs 62*a-c* can have other features and Group-III nitride based sub-LEDs for example, can have other features to assist in spreading current from the contacts. This is particularly applicable to spreading current into p-type Group-III nitrides and the current spreading structure can comprise thin semitransparent current spreading layer covering some or the entire p-type layer. These layers can comprise different materials including but not limited to a metal such as platinum (Pt) or a transparent conductive oxide such as indium tin oxide (ITO).

As mentioned above, the sub-LEDs 62a-c in the embodiment shown are flip-chip mounted to the submount 64. This can occur at the wafer level or at the chip level. For flip-chip mounting at the wafer level many wafer bonding techniques can be used and in the embodiment shown a metal bond stack 68 is included between the sub-LEDs 62a-c and the submount 64, with one or more layers of the metal bond stack 68 being on the sub-LEDs 62a-c and one or more layers being on the submount 64. When the sub-LEDs 62a-c are flip chip mounted to the submount 64, the metal layers from the sub-LEDs 62a-c come in contact with the metal layers from the submount 64. Sufficient heat is applied to cause the metal layers to bond together and when the heat is removed the sub-LEDs 62a-c are held by the metal bond stack 68 to the submount 64. Bond stack layers can be made of different materials such as Ni, Au and Sn, or combinations thereof. Following wafer level bonding, the LED chips 60 can be singulated from the wafer. It is understood that this flip-chip bonding can also occur at the LED chip level or at portions of the wafer level.

The submount 64 can be formed of many different materials such as silicon, ceramic, alumina, aluminum nitride, silicon carbide, sapphire, or a polymeric material such as polymide and polyester etc. In other embodiments the submount 64 can include a highly reflective material, such as reflective ceramics, dielectrics or metal reflectors like silver, to enhance light extraction from the component. In other embodiments the submount 64 can comprise a printed circuit board (PCB), or any other suitable material, such as T-Clad thermal clad insulated substrate material, available from The Bergquist Company of Chanhassen, Minn. For PCB embodiments different PCB types can be used such as standard FR-4 metal core PCB, or any other type of printed circuit board.

As described above, in conventional low voltage and high current single junction LED chips, the LED active layers can be continuous across all or most of submount 64 such that a single junction single LED is provided. An electrical signal is the applied to the single LED in some embodiments with the help of current spreading structures and features. In the LED chip 60, the single junction LED chip is separated into multiple sub-LEDs 62a-c on an insulator layer 70 (described below). Many different methods can be used to accomplish this separation and in one embodiment portions of the continuous LED layers can be etched away using known etching techniques to provide physical separation between the sub-LEDs 62a-c. In other embodiments, portions can be removed using known photolithography techniques. In one embodiment portions of the LED active region and doped layers are being etched down to the insulator 70 to form the open areas between adjacent sub-LEDs 62a-c. In other embodiments, the sub-LEDs can be separated from the single junction LED prior to mounting to the submount 64.

It is understood that the greater the number of sub-LEDs 62a-c results in a greater number of openings formed between sub-LEDs. With each opening a portion of the emitting active area is removed, such that there can be less active area for the LED chip compared to single junction devices covering the same area. There is typically a corresponding reduction in active emission area with the greater the number of sub-LEDs. This reduction in active emission area can result in a corresponding increase in current density and reduction in light emission from the LED chip. The greater the reduction in the active emission area, the smaller that active area utilization ratio (i.e. ratio of active area for sub-LED device compared to the LED footprint). To minimize this reduction in emission area, the alignment tolerances between sub-LEDs should be as small as possible such that the amount of active area that is removed between sub-LEDs is as small as possible. The alignment tolerances between sub-LEDs should be less than 5 microns, with preferred tolerances being less than 2 microns. The active area utilization ratio should be greater than 50%, with suitable embodiments have an active area utilization ratio greater than 75%.

In the embodiment shown, the sub-LEDs 62a-c are connected in series so that a signal applied to the first sub-LED 62a passes through to the remaining serially connected sub-LEDs 62b, 62c. To allow for this type of serial connection, the sub-LEDs 62a-c are electrically insulated from the conductive features below, such as the metal bond stack 68. In other embodiments, the submount 64 can also be conductive, such that the LEDs 62a-c should also be insulated from the submount 64. To provide this electrical insulation, a substrate insulator layer 70 can be included between the sub-LEDs 62a-c and the bond metal stack 68, as well as the submount 64 below. The substrate insulator layer 70 can be deposited on the sub-LEDs 62a-62c using conventional methods and can be deposited prior to flip-chip mounting of the sub-LEDs 62a-c on the submount 64 and prior to deposition of the metal bond layers 68. The insulating layer 70 can be made of many different insulating materials including but not limited to silicon nitride (SiN), aluminum nitride (AlN), silicon dioxide ($SiO_2$), titanium dioxide ($TiO_2$), or aluminum oxide ($Al_2O_3$). In some embodiments, the insulating layer 70 can also act as an etch stop layer for the etch used to separate the single LED junction into multiple sub-LEDs.

The insulating layer 70 can have many different thicknesses, with the thickness being sufficient to withstand the voltage applied to the serially connected sub-LEDs 62a-c. For example, for an LED chip embodiment having 50 volts applied to its sub-LEDs, the insulating layer can have a thickness of 1,000 to 10,000 angstroms Å. It is understood, however, that the insulating layer can have many different thicknesses as well. Thicker layers can provide the additional advantage of compensating for small manufacturing defects formed in the insulating layer during deposition. Thicker layers, however, can also reduce the ability of the LED chip to spread heat from the sub-LEDs to the submount. Accordingly, there is a trade-off between defect tolerance and thermal dissipation when determining the best thickness for a particular LED chip.

Conductive bottom contact layers 72a-c are included with each being between a respective one of the sub-LEDs 62a-c and the insulator layer 70. Each of the bottom contacts 72a-c comprises an electrically conductive material to spread current to the bottom layer of each of the sub-LEDs 62a-c, with suitable materials being those listed above for the first and second contacts. The bottom contact layers 72a-c can be fabricated using known techniques such as sputtering or ebeam techniques.

Some or all of the sub-LEDs 62a-c can be coated with one or more phosphors with the phosphors absorbing at least some of the LED light and emitting a different wavelength of light such that the LED emits a combination of light from the LED and the phosphor. This coating can be applied to the sub-LEDs after separation of the sub-LEDs 62a-c from the single junction as described above. Different embodiments according to the present invention comprise white emitting sub-LEDs that emit light in the blue wavelength spectrum with the phosphor absorbing some of the blue light and re-emitting yellow. The sub-LEDs 62a-c emit a white light combination of blue and yellow light. In one embodiment the phosphor comprises commercially available YAG:Ce, although a full range of broad yellow spectral emission is possible using conversion particles made of phosphors based on the $(Gd,Y)_3(Al,Ga)_5O_{12}$:Ce system, such as the $Y_3Al_5O_{12}$: Ce (YAG). Other yellow phosphors that can be used for white emitting LED chips include: $Tb_{3-x}RE_xO_{12}$:Ce (TAG); RE=Y, Gd, La, Lu; or $Sr_{2-x-y}Ba_xCa_ySiO_4$:Eu.

It is understood that the different sub-LED 62a-c can be coated with different types of phosphors to absorb LED light and emit different colors of light. For example, different yellow, green or red phosphors can be used that exhibit excitation in the blue and/or UV emission spectrum. Many of these provide a desirable peak emission, have efficient light conversion, and have acceptable Stokes shift.

The sub-LEDs 62a-c can be coated with a phosphor using many different methods, with one suitable being described in U.S. patent application Ser. Nos. 11/656,759 and 11/899,790, both entitled "Wafer Level Phosphor Coating Method and Devices Fabricated Utilizing Method", and both of which are incorporated herein by reference. Alternatively the LEDs can be coated using other methods such as electrophoretic deposition (EPD), with a suitable EPD method described in U.S. patent application Ser. No. 11/473,089 entitled "Close Loop Electrophoretic Deposition of Semiconductor Devices", which is also incorporated herein by reference. It is understood that LED packages according to the present invention can also have multiple LEDs of different colors, one or more of which may be white emitting.

To allow for serial interconnection, each of the sub-LEDs 62a-c can also have first and second side insulators 74, 76. Each of the first side insulators 74 provides electrical insulation between its one of the sub-LEDs 62a-c and the contact or trace that carries an electrical signal to the top surface of the sub-LEDs 62a-c (e.g. the n-type layer). This prevents the electrical signals applied to the top layers from shorting to unintended layers or contacts of the LEDs. For example, the first sub-LED 62a has a top wire bond pad 78 that is in electrical contact with one of the first sub-LEDs contacts. The first insulator 74 on sub-LED 62a electrically insulates the side surfaces and bottom contact 72a from the wire bond pad 78 so that an electrical signal applied to the wire bond pad 78 spreads into the top layer of the sub-LED 62a.

A first electrical connector trace 80 connects the bottom contact 72a from the first sub-LED 62a to the top layer of the second sub-LED 62b. The first insulator 74 on the second sub-LED 62b electrically insulates the side surfaces of the second sub-LED 62b from the first electrical connector trace 80 so that an electrical signal from the bottom contact 72a spreads into the top surface of the second sub-LED 62b. The first side insulator layer 74 on the third sub-LED 62c similarly insulates the side of the third sub-LED 62c from the second electrical trace 82 that connects the second sub-LED's bottom contact to the top surface of the third sub-LED 62c.

The second side insulating layer 76 on the first sub-LED 62a insulates the side surfaces of the first sub-LED 62a from the first electrical trace 80 to prevent shorting of the trace 80 to the first sub-LED 62a. Similarly, the second side insulating layer 76 on the second sub-LED 62b prevents shorting of the second electrical trace 82 to the second sub-LED 62b. A second wire bond pad 84, is included on the bottom contact 72c for the third sub-LED 62c, and the second side insulating layer 76 on the third sub-LED 62c insulates the third sub-LED 62c from the second wire bond pad 84. This arrangement of side insulators, bond pads, and electrical traces allows for an electrical signal applied to the LED chip 60 to properly transmit serially through the sub-LEDs 62a-c. The side insulator layers 74, 76 can be made of many different such as those used for the submount insulator layer 70, including but not limited to SiN, AlN, $SiO_2$, $TiO_2$, or $Al_2O_3$, deposited using known techniques.

Each of the bottom contact layers 72a-c can also comprise a mirror contact 86 adjacent the bottom surface of one or more of the sub-LEDs 62a-c. The mirror can cover the entire bottom surface of the sub-LEDs 62a-c or can cover less than the entire bottom surface so that it is aligned with the light emission opening of the each of the sub-LEDs top surface (i.e. the portion of the top surface not covered by the wire bond pads, traces and insulating materials). The mirror contact 86 can comprise many different materials such as reflective metals, or can comprise reflective structures such as a distributed Bragg reflector (DBR). In addition to serving as an ohmic contact to the bottom layer of the sub-LEDs 62a-c, each mirror is arranged to reflect light emitted from the active region of one of the sub-LED 62a-c toward the submount 64 so that the light contributes to useful emission from the top surface of its one of the sub-LEDs 62a-c.

In operation, wire bonds can be coupled to the first and second wire bond pads 78, 84 so that an electrical signal can be applied to the sub-LEDs 62a-c. The electrical signal passes through the first sub-LED 62a and is conducted to the second sub-LED 62b along first electrical trace 80. The signal passes through the second sub-LED 62b and is conducted to the third sub-LED along second electrical trace 82. The signal then passes through the third sub-LED 62c, with all the sub-LEDs emitting light in response to the electrical signal applied to the wire bond pads 78, 84.

FIG. 12 shows another embodiment of a monolithic LED chip 100 according to the present invention comprising a sub-LEDs 102a-c. The LED chip 100 has many of the similar features as the LED chip 60 and for those similar features the same reference numbers will be used in describing this embodiment (and subsequent embodiments) with the understanding that the description above is applicable to this embodiment. The LED chip 100 comprises a submount 64, with a bond metal stack 68 and submount insulator layer 70 arranged successively on the submount 64. Bottom contacts 72a-d are included with each one being between one of the sub-LEDs 102a-c and the insulator layer 70.

The sub-LEDs 102a-c can have the same features as sub-LEDs 62a-c described including the semiconductor layers, contacts, phosphors, buffer, nucleation, contact and current spreading layers as well as light extraction layers and elements. The sub-LEDs 102a-c can also be flip-chip mounted to the submount 64 as described above with the sub-LEDs 102a-c separated from a single junction LED and serially coupled together. The sub-LEDs 102, however, have lateral geometry instead of vertical geometry, such that the contacts for each of the sub-LEDs are accessible from each of the sub-LEDs bottom surface. In one embodiment of a lateral geometry device, a portion of each of sub-LEDs p-type layer and active region is removed, such as by etching to expose a contact mesa on the n-type layer. A contact area is provided on the mesa of the n-type layer such that the contacts of the sub-LEDs are contacted from the same side; the bottom surface in this case. The contacts are formed prior to being covered by the insulator layer 70, and prior to flip-chip mounting to the submount 64.

The bottom contact 72a between the first sub-LED 102a and the insulator layer 70 comprises a first wire bond pad 78 arranged so that an electrical signal applied to it spreads into the bottom contact 72a. The electrical signal spreads from the bottom contact 72a into first sub-LED 102a. The first contact mesa 104a of first sub-LED 102a overlaps the second bottom contact 72b and a first contact 106a is arranged between contact mesa 104a and the second bottom contact 72b. An electrical signal at the first contact mesa 104a conducts through the first contact 106a to the second bottom contact 72b. The electrical signal at the second bottom contact 72b spreads into the second sub-LED 102b. Similarly, the second contact mesa 104b overlaps the third bottom contact 72c, and a second contact 106b spreads current from the second contact mesa 104b to the third bottom contact 72c. The electrical signal at the third bottom contact 72c spreads into the third sub-LED 102c. The third contact mesa 104c overlaps the fourth bottom contact 72d, and a third contact 106c spreads current to the fourth bottom contact 72d. A second wire bond pad 84 is on the fourth bottom contact 72d.

Insulation regions 108 are included adjacent to the wire bond pads 78, 84, and the first, second and third mesa contacts to insulate them from the adjacent semiconductor layers of the sub-LEDs 102a-c. This prevents shorting of these features to undesirable layers of the sub-LEDs 102a-c. The insulator regions 108 can be made of the same material as the side insulators described above including but not limited to SiN, AlN, $SiO_2$, $TiO_2$, or $Al_2O_3$, deposited using known techniques.

Like the LED chip 60 described above, wire bonds can be coupled to wire bond pads 78, 84 and an electrical signal passes from the wire bond pads 78, 84 serially through the sub-LEDs 102a-c. A signal passes from wire bond pad 78 to the first bottom contact 72a, through sub-LED 102a and to the first contact mesa 104a. The signal at the first contact mesa 104a spreads into the second bottom contact 72b and continues similarly through sub-LEDs 102b, 102c to the second wire bond pad 84. The LED chip 100 is provided without the need for wire bonds or conductive traces covering the sub-LEDs 102a-c.

FIG. 13 shows still another embodiment of an LED chip 130 according to the present invention that has vertical geometry sub-LEDs 132a-c serially fabricated and interconnected in the same way as the sub-LEDs 62a-c in LED chip 60 described above. In this embodiment, however, the submount 134 comprises an insulating material, and accordingly features do not need to be included to insulate the sub-LEDs 132a-c from the submount 134. Instead, the sub-LEDs can be mounted to the submount 134 using a dielectric wafer bond layer 136 between the submount 134 and the sub-LEDs 132a-c. An electrical signal spreads serially through the sub-LEDs 132a-c from wafer bond pad 78, through the bottom contact 72a-c, through the first and second electrical traces 80, 82 and to the second wire bond pad 84. Because the submount 134 is insulating, the electrical signal passing though these features does not short to the submount. Further, because the submount 134 is insulating the electrical breakdown characteristics of the dielectric layer 136 is less critical.

Figure 14:
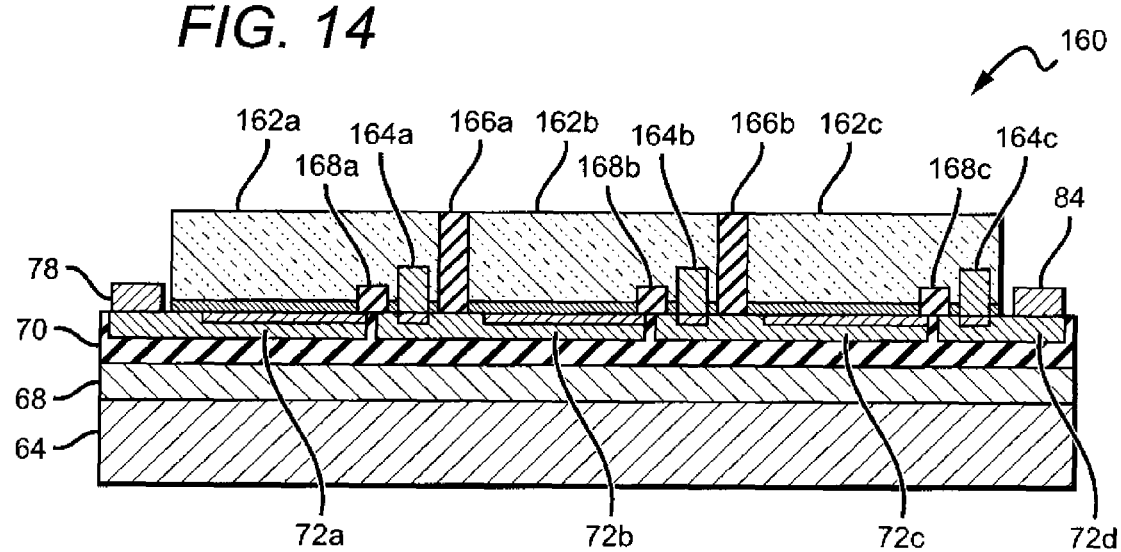
FIG. 14 is a sectional view of another embodiment of a monolithic LED chip according to the present invention.

FIG. 14 shows still another embodiment of a monolithic LED chip 160 according to the present invention that relies on other means to separate the sub-LEDs 162a-c. The sub-LEDs 162a-c have lateral geometry although this embodiment is equally applicable to vertical geometry devices. The sub-LEDs 162a-c are flip-chip mounted on a submount 64, with a metal bond stack 68 and submount insulator layer 70. Each of the bottom contacts 72a-d is arranged between the sub-LEDs 162a-c in a similar manner to the arrangement shown in LED chip 100 in FIG. 12. A first wire bond pad 78 is on the bottom contact 72a, and a second wire bond pad 84 is on the bottom contact 72d.

Instead of mechanical separation of the sub-LEDs 162a-c from the single junction LED, the different regions are isolated electrically from one another using isolation implants to form insulating or semi-insulating regions in the LED's semiconductor material. Different implants are also used to create conductive paths from through the LED's semiconductor material to allow for lateral geometry operation of the sub-LEDs without having to form a contact mesa.

In the embodiment shown, first, second and third conductive implants 164a-c are included in the sub-LEDs 162a-c, with each providing a conductive paths from one of the first, second and third bottom contacts 72b-c, respectively, to one of the doped layers within each of the sub-LEDs. For flip-chip sub-LEDs the conductive paths run from the bottom contacts 72b-c to the n-doped layer. The conductive paths can be formed using n+ implanting of compounds such as silicon and oxygen, although other Group V or VI elements can also be used. Known ion implanting methods can be used, and in some embodiments the n+implant may require activation by annealing. The conductive implants 164a-c provide the advantage of having a conductive path to the n-doped semiconductor layer without having to form a contact mesa. It is understood, however, that this arrangement can also be used in embodiments having a contact mesa as described above.

Deep isolation implants 166a, 166b can be used to provide electrical isolation between the sub-LEDs 162a-c, with each of the implants extending through the semiconductor material of the LED. Many different materials can be used for the isolation implant including, but not limited to, nitrogen or iron. These implants 166a, 166b comprise semi-insulating or insulating regions that block conduction between adjacent sub-LEDs in much that same way as mechanical separation.

Shallow isolation implants 168a-c are provided in the sub-LEDs 162a-c over each of the spaces between the bottom contacts 72a-d with each of the shallow implants 168a-c passing up through the bottom doped layer of its one of the sub-LED 162a-c. In the embodiment shown the bottom doped layer comprises the p-type doped layer. The shallow isolation implants 168a-c block electrical signals passing through each of the p-type layers from shorting to the conductive implants 164a-c and the adjacent ones of the bottom contacts 72b-d. This provides a path for the electrical signal through each of the sub-LEDs 162a-c that causes them to emit, with the sub-LEDs 162a-c electrically connected in series between the first and second wire bond pads 78, 84.

Figure 15:
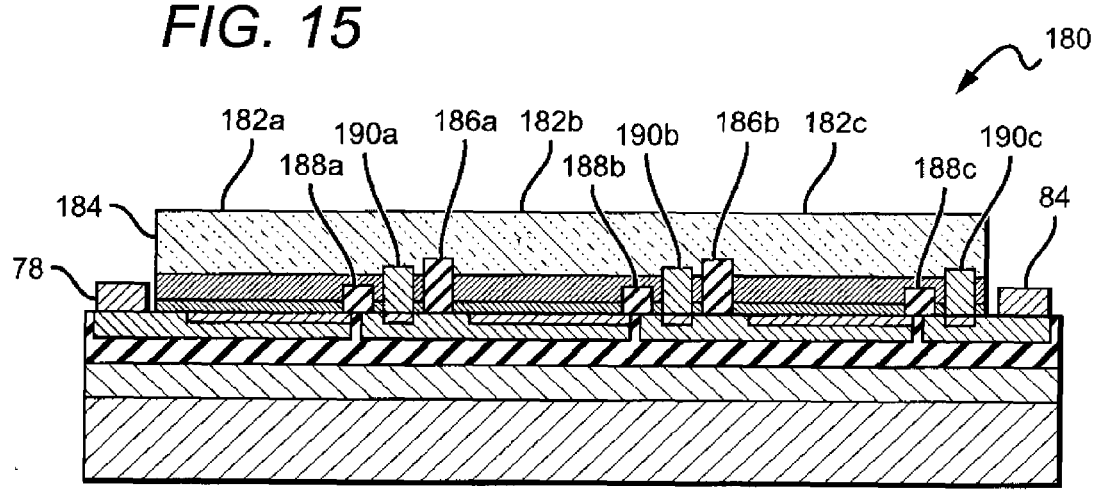
FIG. 15 is a sectional view of still another embodiment of a monolithic LED chip according to the present invention.

FIG. 15 shows still another embodiment of an LED 180 according to the present invention having sub-LEDs 182a-c also relying on implants to form insulating or semi-insulating regions in the LED's semiconductor material and implants to create conductive paths. In this embodiment, however, the single junction LED comprises an insulating or semi-insulating buffer layer 184. To form the necessary insulation between adjacent ones of the sub-LEDs 182a-c isolation implants 186a, 186b are included that pass through the semiconductor material to the buffer layer. Current is blocked from passing between the sub-LEDs 182a-c by the isolation implants 186a, 186b and the buffer layer 184. Shallow isolation implants 188a-c that are similar to the shallow isolation implants 168a-c in LED chip 160, and also electrically isolate the p-type layer from the n-contact. Conductive implants 190a-c are also included that are similar to conductive implants 164a-c and provide electrical connection to the n-type layer through other semiconductor layers of the LED chip 180. This arrangement also provides a path for the electrical signal through each of the sub-LEDs 182a-c that causes them to emit, with the sub-LEDs 182*a-c* electrically connected in series between the first and second wire bond pads 78, 84.

As mentioned above, one of the advantages of the present invention is its increased failure tolerance compared to single junction LED chips. Referring now to FIG. 16, a monolithic LED chip 210 is shown having a plurality of sub-LEDs 212 serially connected on a submount 214. Sub-LED 212*a* is shown as a sub-LED with a failed junction. When this sub-LED junction fails, the sub-LED 212*a* may not emit light, but it can still conduct such that the electrical signal applied to sub-LED 212*a* will conduct to the remaining sub-LEDs that follow in the serial connection. The result is that all the sub-LEDs 212 can emit except the one failed sub-LED 212*a*. In many applications the reduction in luminous flux from a single failed sub-LED can be acceptable. By contrast, when the junction fails in a single junction LED chip, the device does not emit light and cannot be used.

The present invention can be used in many different lighting application, and in particular those using a small sized high output light source. Some of these include, but are not limited to, street lights, architectural lights, home and office lighting, display lighting and backlighting.

Although the present invention has been described in detail with reference to certain preferred configurations thereof, other versions are possible. Therefore, the spirit and scope of the invention should not be limited to the versions described above.

We claim:

1. A LED chip, comprising:
    a plurality of sub-LEDs mounted on a submount, wherein said sub-LEDs are formed from a single junction LED;
    an insulator layer between said submount and said sub-LEDs; and
    electrically conductive and electrically insulating features serially interconnecting said sub-LEDs such that an electrical signal applied to said serially interconnected sub-LEDs along said electrically conductive features spreads to said serially interconnected sub-LEDs, wherein said electrically conductive features comprises a plurality of connector traces serially interconnecting said sub-LEDs.

2. The LED chip of claim 1, wherein the voltage necessary to drive said sub-LEDs is dependent on the number of said serially interconnected sub-LEDs and the junction voltage of said sub-LEDs.

3. The LED chip of claim 1, wherein said sub-LEDs are formed from a single junction LED by removing portions of said single junction LED.

4. The LED chip of claim 3, wherein said sub-LEDs are formed from a single junction LED by isolation implants.

5. The LED chip of claim 3, wherein the active area utilization ratio is greater than 50%.

6. The LED chip of claim 3, wherein the active area utilization ratio of said single junction LED active region is greater than 75%.

7. The LED chip of claim 1, wherein said sub-LEDs are flip-chip mounted on said submount.

8. A LED chip, comprising:
    a plurality of sub-LEDs mounted on a submount;
    a plurality of bottom contacts, each of which is between one of said sub-LEDs and said submount;
    connector traces serially interconnecting said sub-LEDs; and
    insulating features to insulate portions of said sub-LEDs from said connector traces.

9. The LED chip of claim 8, wherein said the drive voltage is dependent on the number of said serially interconnected sub-LEDs and the junction voltage of said sub-LEDs.

10. The LED chip of claim 8, further comprising an insulating layer between said sub-LEDs and said submount.

* * * * *